US009904267B2

(12) United States Patent
Tupala (10) Patent No.: US 9,904,267 B2
(45) Date of Patent: Feb. 27, 2018

(54) METHOD AND APPARATUS FOR DETERMINING DIRECTION OF POWER DELIVERY

(71) Applicant: Nokia Technologies Oy, Espoo (FI)

(72) Inventor: Miika Tupala, Turku (FI)

(73) Assignee: Nokia Technologies Oy, Espoo (FI)

( * ) Notice: Subject to any disclaimer, the term of this patent is extended or adjusted under 35 U.S.C. 154(b) by 337 days.

(21) Appl. No.: 14/676,741

(22) Filed: Apr. 1, 2015

(65) Prior Publication Data

US 2015/0293514 A1 Oct. 15, 2015

(30) Foreign Application Priority Data

Apr. 9, 2014 (FI) ..................................... 20145338

(51) Int. Cl.
| | | |
|---|---|---|
| *G06F 1/00* | (2006.01) |
| *G05B 19/042* | (2006.01) |
| *H01H 47/00* | (2006.01) |
| *G01R 19/165* | (2006.01) |
| *G06F 1/26* | (2006.01) |

(52) U.S. Cl.
CPC ... *G05B 19/0428* (2013.01); *G01R 19/16595* (2013.01); *G06F 1/266* (2013.01); *H01H 47/00* (2013.01); *G05B 2219/2639* (2013.01)

(58) Field of Classification Search
CPC ........ G05B 19/0426; G05B 2219/2639; G06F 1/266; G01R 19/16595; H01H 47/00
See application file for complete search history.

(56) References Cited

U.S. PATENT DOCUMENTS

| 7,447,922 B1 | 11/2008 | Asbury et al. |
| 2010/0060233 A1 | 3/2010 | Kung et al. |
| 2012/0231857 A1 | 9/2012 | Hsu |
| 2013/0007336 A1 | 1/2013 | Chun et al. |
| 2013/0166928 A1 | 6/2013 | Yang |

FOREIGN PATENT DOCUMENTS

| JP | 2002-237972 A | 8/2002 |
| JP | 2005-149293 A | 6/2005 |
| JP | 2005-250943 A | 9/2005 |

(Continued)

OTHER PUBLICATIONS

Office action received for corresponding Japanese Patent Application No. 2015-054119, dated Jun. 10, 2016, 3 pages of office action and 4 pages of office action translation available.

(Continued)

*Primary Examiner* — Xuxing Chen
(74) *Attorney, Agent, or Firm* — Mintz Levin Cohn Ferris Glovsky and Popeo, P.C.

(57) ABSTRACT

Various embodiments are disclosed relating to techniques for exchanging data and/or power between a plurality of devices. In accordance with an example embodiment of the present invention, a device may receive power via a voltage terminal of an interface. The interface may also comprise at least one configuration channel terminal. The device may determine to terminate power reception via the voltage terminal causing a current through the configuration channel terminal to decrease below a threshold, and the device may determine to supply power to the voltage terminal.

20 Claims, 6 Drawing Sheets

(56) References Cited

FOREIGN PATENT DOCUMENTS

JP          2013-051797 A      3/2013
WO          2014/006619 A1     1/2014

OTHER PUBLICATIONS

"Details Are Published of Reversible USB Type-C Connector Standard", PC Watch, Retrieved on Jul. 4, 2016, Webpage available at : http://pc.watch.impress.co.jp/docs/news/642743.html.

U.S. Appl. No. 14/175,867, "Charging and Audio Usage", filed Feb. 7, 2014, pp. 1-24.

Office action received for corresponding Finland Patent Application No. 20145338, dated Dec. 9, 2014, 7 pages.

Extended European Search Report received for corresponding European Patent Application No. 15161578.8, dated Jun. 5, 2015, 7 pages.

"USB Power Delivery Specification", Universal Serial Bus, Version 1.0, Jul. 16, 2012, pp. 1-11.

"Universal Serial Bus Type-C Cable and connectoe Specification", USB Newark WG, USB 3.0 Promoter Group, Revision 0.7 working draft, Feb. 2014.

Office action received for corresponding Japanese Patent Application No. 2015-054119, dated Nov. 17, 2016, 3 pages of office action and translation provided.

METHOD AND APPARATUS FOR DETERMINING DIRECTION OF POWER DELIVERY

TECHNICAL FIELD

The present application relates generally to the field of data and power interfaces, wherein data and/or power is exchanged between a plurality of devices.

BACKGROUND

Electronic devices may be equipped with various interfaces to enable power and/or data delivery to and from the device. One example of such interface is the Universal Serial Bus (USB), which may be used in many types of apparatuses such as for example mobile phones, laptops, tablets, PDAs, and the like. The same interface may be also used in accessories such as for example audio headsets, wall chargers, spare battery packs, keypads, docking stations, external hard drives, or camera grips. Power and data interfaces may take various forms including both wired and wireless interfaces. One example of a wired interface is the USB Type-C connector, which enables devices to communicate according to many data communication standards, such as for example USB 2.0, USB 3.0, and USB 3.1, as well as any future revisions thereof.

SUMMARY

Various aspects of examples of the invention are set out in the claims. According to a first aspect of the present invention, a method is disclosed. The method may comprise determining to terminate receiving power via a voltage terminal; causing a current through a configuration channel terminal to decrease below a first threshold to cause termination of power reception via the voltage terminal; and determining to supply power to the voltage terminal; monitoring a voltage at the configuration channel terminal or a current through the configuration channel terminal; and determining to stop supplying power to the voltage terminal, in response to detecting a change in the voltage at the configuration channel terminal or the current through the configuration channel terminal.

According to a second aspect of the present invention, an apparatus is disclosed. The apparatus may comprise an interface comprising a voltage terminal and at least one configuration channel terminal; at least one processor; at least one memory including computer program code; the at least one memory and the computer program code configured to, with the at least one processor, cause the apparatus at least to: determine to terminate receiving power via the voltage terminal and cause a current through the configuration channel terminal to decrease below a first threshold to cause termination of power reception via the voltage terminal; determine to supply power to the voltage terminal; monitor a voltage at the configuration channel terminal or a current through the configuration channel terminal; and determine to stop supplying power to the voltage terminal, in response to detecting a change in the voltage at the configuration channel terminal or the current through the configuration channel terminal.

According to a third aspect of the present invention, a method is disclosed. The method may comprise connecting a power source to a voltage terminal, wherein the power source is further connected to at least one configuration channel terminal of an interface; monitoring a voltage at the configuration channel terminal or a current through the configuration channel terminal; in response to detecting a change in the voltage at the configuration channel terminal or the current through the configuration channel terminal, determining to disconnect the power source from the voltage terminal; and receiving power via the voltage terminal while keeping the power source connected to the configuration channel terminal.

According to a fourth aspect of the present invention, an apparatus is disclosed. The apparatus may comprise an interface comprising a voltage terminal and at least one configuration channel terminal; a power source connected to the at least one configuration channel terminal; at least one processor; at least one memory including computer program code; the at least one memory and the computer program code configured to, with the at least one processor, cause the apparatus at least to: connect the power source to the voltage terminal; monitor a voltage at the configuration channel terminal or a current through the configuration channel terminal; in response to detecting a change in the voltage at the configuration channel terminal or the current through the configuration channel terminal, determine to disconnect the power source from the voltage terminal; and receive power via the voltage terminal while keeping the power source connected to the configuration channel.

According to a fifth aspect of the present invention, a computer-readable medium is disclosed. The computer-readable medium may be encoded with instructions that, when executed by a computer, perform: determining to terminate receiving power via a voltage terminal; causing a current through a configuration channel terminal to decrease below a threshold to cause termination of power reception via the voltage terminal; determining to supply power to the voltage terminal; monitoring a voltage at the configuration channel terminal or a current through the configuration channel terminal; and determining to stop supplying power to the voltage terminal, in response to detecting a change in the voltage at the configuration channel terminal or in the current through the configuration channel terminal.

According to a sixth aspect of the present invention, a computer-readable medium is disclosed. The computer-readable medium may be encoded with instructions that, when executed by a computer, perform: connecting a power source to a voltage terminal, wherein the power source is further connected to at least one configuration channel terminal of an interface; monitoring a voltage at the configuration channel terminal or a current through the configuration channel terminal; in response to detecting a change in the voltage at the configuration channel terminal or the current through the configuration channel terminal, determining to disconnect the power source from the voltage terminal; and receiving power via the voltage terminal while keeping the power source connected to the configuration channel terminal.

According to a seventh aspect of the invention an apparatus is disclosed. The apparatus may comprise means for determining to terminate receiving power via a voltage terminal; means for causing a current through a configuration channel terminal to decrease below a threshold to cause termination of power reception via the voltage terminal; means for determining to supply power to the voltage terminal; means for monitoring a voltage at the configuration channel terminal or a current through the configuration channel terminal; and means for determining to stop supplying power to the voltage terminal, in response to detecting a change in the voltage at the configuration channel terminal or in the current through the configuration channel terminal.

According to an eighth aspect of the invention an apparatus is disclosed. The apparatus may comprise means for connecting a power source to a voltage terminal, wherein the power source is further connected to at least one configuration channel terminal of an interface; means for monitoring a voltage or a current at the configuration channel terminal; means for disconnecting the power source from the voltage terminal; and means for receiving power via the voltage terminal, in response to detecting a change in the voltage at the configuration channel terminal or the current through the configuration channel terminal, while keeping the power source connected to the configuration channel terminal.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

Standardized data interfaces, such as for example specified by the USB Implementers Forum, may be used in many different types of devices and therefore a data interface should allow devices to use the interface in a flexible way. For example, the same interface may be used by devices that are coupled to mains power, powered by a battery, coupled to an energy harvesting source such as a solar panel, or connected to a docking station or a 12 V power interface in a car. Moreover, the power capabilities of a device may change during data transfer or power delivery via the interface. For example, a user may unplug the device from the mains power, battery level of the device may drop below the minimum level for operation, an energy harvesting source may not be capable of providing sufficient power anymore, or the ignition of a car may be switched off or switched on. For example in these cases, it may be useful to allow the connected devices to change the direction of power delivery in the data interface.

Many communication systems assign different roles for apparatuses coupled via a data interface. For example, one apparatus may be assigned to operate as a "host" and another apparatus may be assigned to operate as a "device". In some cases there may be a plurality of device apparatuses. Responsibilities of a host apparatus may include supplying power to the device apparatus and managing the communication between the apparatuses. In some systems, the host may be called a master and the device may be called a slave. The connected apparatuses may be also capable of changing their roles, that is, an apparatus acting initially as a device may become a host and start supplying power to the another apparatus. Changing the roles between the apparatuses may involve negotiation between the devices and changing the power delivery roles may also affect data transmission. For example, data transmission may need to be interrupted during the power delivery role negotiation, and after the negotiation the apparatuses may need to assume also new data transfer roles. In some applications, it would be beneficial to change only the power delivery roles without disturbing the data transfer. In addition, changing the direction of the current should be as fast as possible.

An example embodiment of the present invention and its potential advantages are understood by referring to FIGS. 1 through 6 of the drawings.

Figure 1:
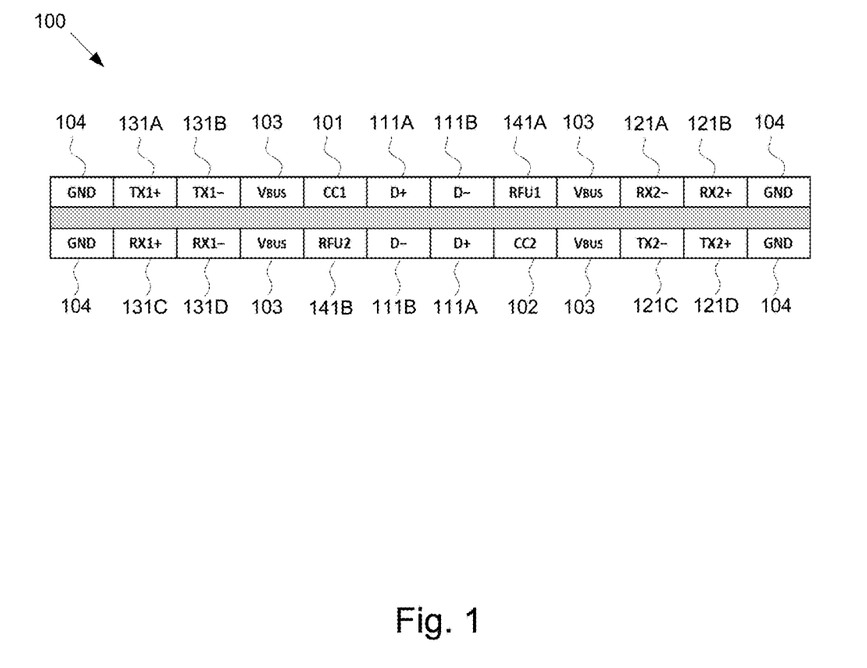
FIG. 1 illustrates an example of a connector in accordance with an exemplary data interface.

FIG. 1 illustrates a connector 100 of a data interface. Connector 100 may for example comprise a receptacle that is configured to receive a mating plug such that a connection to another apparatus can be established. Alternatively, connector 100 may comprise a plug that is configured to be inserted into a mating receptacle. Hence, in the embodiments of the invention, connector 100 may be a plug or a receptacle. Examples of apparatuses comprising a receptacle may include user apparatuses such as for example mobile phones or laptops, but other apparatuses may use receptacles as well. Examples of apparatuses comprising a plug may include for example chargers, docking stations, or camera grips. In some cases, two apparatuses each comprising a receptacle may be connected together by a cable that comprises a plug at each end of the cable.

In general, embodiments of the invention may be implemented in various types of apparatuses and accessories or modular designs with a plurality of connected apparatuses forming a functional entity. Chargers may include wall chargers comprising a captive cable with a plug or wall chargers configured to be used with a removable cable, such as for example a USB-A to USB Type C cable. Chargers may include also any portable charging accessories such as for example spare batteries or portable power packs. A camera grip may refer to an accessory configured to be coupled to an apparatus comprising a camera, such as for example a mobile phone, to make controlling of the camera easier. A camera grip may be communicatively coupled to a camera to exchange instructions and information, for example relating to capturing an image. A camera grip may also comprise a wired power supply interface or a battery with high capacity and hence the camera grip may also be able to supply power to the camera.

Connector 100 may have a symmetrical dual-row structure that enables a plug to be inserted in a receptacle in both possible orientations: in the normal way or upside-down. Connector 100 may comprise one or more configuration channel (CC) pins or terminals 101 and 102, labeled as CC1 and CC2, which may be intended for detecting the orientation of the plug. A cable that is connected between two receptacles may have only one CC pin at each end of the cable and these CC pins are connected by a wire inside the cable. Hence, there may be only one configuration channel route between two apparatuses connected via the interface using connector 100.

Connector 100 may comprise one or more voltage bus terminals (VBUS) 103 to enable power delivery through connector 100. VBUS 103A may be also referred to as a voltage terminal, voltage pin, VBUS pin, voltage connection, or the like. Connector 100 may also comprise one or more ground terminals 104 (GND) and one or more terminals reserved for future use 141A, 141B (RFU1, RFU2). Connector 100 may support data transfer using a plurality of protocols. For example, data terminals 111A, 111B may be reserved for legacy data communication using USB 2.0 standard and high speed data terminals 121A-D and 131A-D may be reserved for two USB 3.0 data transfer interfaces. Detecting the connected CC pin (101 or 102) may enable a device to use the correct pins for data communication depending on the orientation of the plug.

Although FIG. 1 presents a dual-row connector, embodiments of the invention can be applied equally in case of a single row connector. A single-row connector may for example comprise only the upper row or the lower row of the connector 100 shown in FIG. 1. Also, in some embodiments of the invention, connector 100 may not have all terminals illustrated in FIG. 1. For example, connector 100 may comprise a single CC pin 101 and single VBUS terminal 103, or, a plurality of VBUS terminals 103 and a plurality of CC pins 101, 102, and combinations thereof. This may be the case for example when applying the invention to simple charger accessories that do not need to implement any data transfer functionalities.

Figure 2:
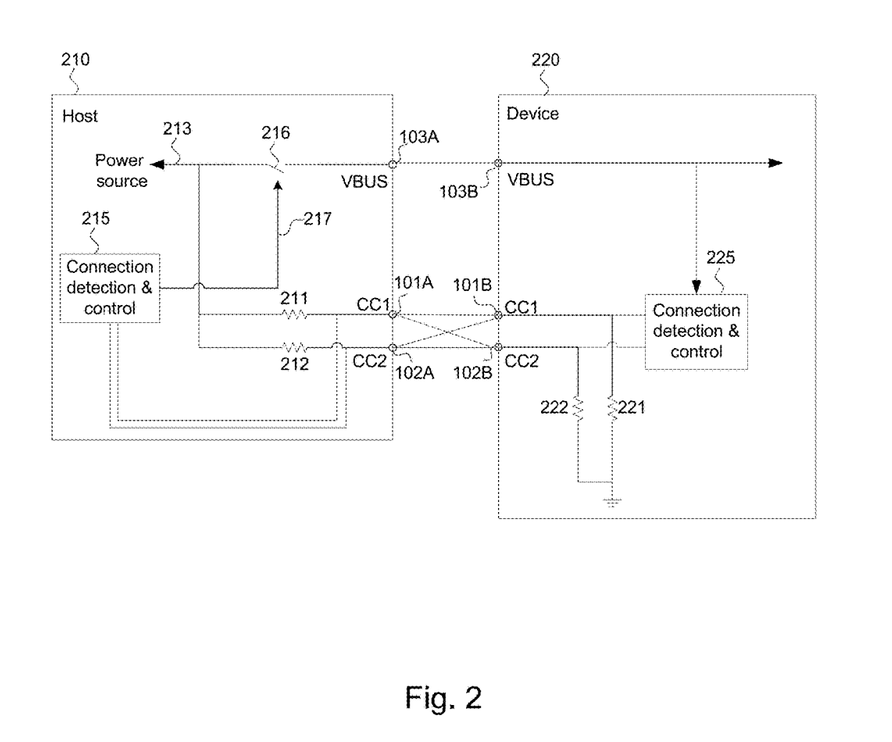
FIG. 2 illustrates an example of a host apparatus and a device apparatus coupled together via a data interface and a cable.

FIG. 2 presents an exemplary block diagram of a host apparatus 210 and an exemplary block diagram of a device apparatus 220.

Host 210 comprises an interface including a voltage bus terminal 103A (VBUS), and at least one CC pin 101A. In some embodiments the interface may comprise a plurality of CC pins, for example a pair of CC pins 101A and 102A. The terminals of the interface may be for example part of the connector 100 as illustrated in FIG. 1. CC pins 101A, 102A may be connected to a power source 213 by pull-up resistors 211, 212. In some embodiments, the power source 213 may be a voltage source. In some embodiments, the power source may be a current source capable of adjusting a current through the CC pins and hence the pull-up resistor may not be needed. Power source 213 may be configured to be connected to VBUS terminal 103A by a VBUS switch 216, which may be controlled by VBUS control signal 217 from control circuitry 215. Control circuit 215 may be configured to detect a connection to another apparatus. Control circuitry 215 may be for example coupled to at least one CC pin 101A, 102A to monitor at least one of a voltage and a current. In another embodiment, control circuitry 215 may monitor current and/or voltage between power source 213 and pull-up resistors 211 and 212. Although power source 213 has been illustrated as one logical entity, it may be in practice implemented by a plurality of different or similar current and/or voltage sources. For example, a first voltage or current source may supply power to the CC pins 211, 212 and a second voltage or current source may supply power to VBUS terminal 103A.

Device 220 may comprise an interface including a voltage bus terminal 103B (VBUS), and at least one CC pin 101B. In some embodiments the interface may comprise a plurality of CC pins, for example a pair of CC pins 101B and 102B. The terminals of the interface may be for example part of the connector 100 as illustrated FIG. 1. CC pin 101B may be connected to a reference potential, for example a ground potential, by pull-down resistor 221. CC pin 102B may be connected to the same or a different reference potential by pull-down resistor 222. Control circuitry 225 may be coupled to at least one CC pin 101B, 102B to monitor at least one of a voltage and a current.

When host 210 and device 220 are connected together by a cable, a connection is established through one CC pin at the host side and one CC pin at the device side. In this example, there are four possible connections that are illustrated by the dashed lines between CC pins 101A, 102A, 101B, and 102B. Hence, when host 210 is connected to device 220, a current starts to flow from power source 213 via one of the pull-up resistors (211 or 212) and one CC pin (101A or 102A) of the host 210 to the connected CC pin (101B or 102B) and continue through one of the pull-down resistors (221 or 222) to ground. Control circuitry 215 of the host may detect a current at the connected CC pin and determine that a connection to a compatible device has been established. Control circuitry may also determine the orientation of the plug based on detecting whether the current flows through terminal CC1 or CC2. Based on the determined plug orientation, the host may assign different communication circuitries (not shown) to the appropriate data terminals of the interface.

In response to determining that a connection has been established, control circuitry 215 may cause VBUS switch 216 to be closed by setting VBUS control signal 217 to an enabled state. Thus, host 210 may begin to supply power from power source 213 to device 220 through VBUS terminal 103A. Control circuitry 215 may continue to monitor a current through the established configuration channel (CC) connection to determine whether connection to device 220 is maintained. If control circuitry 220 detects that current through the configuration channel (CC) connection is significantly reduced, control circuit 215 may cause VBUS switch 216 to be opened by setting VBUS control signal 217 to a disabled state.

When host 210 and device 220 are connected together, control circuitry 225 at the device 220 may detect a current through the connected CC pin and determine that a connection to a compatible host has been established. Control circuitry 225 may also determine the orientation of the plug based on detecting whether the current flows through terminal CC1 or CC2. Based on the determined plug orientation, the device 220 may assign different communication circuitries (not shown) to the appropriate terminals of the interface. After connection to a compatible host has been established, device 220 begins to receive power from VBUS terminal 103B.

FIG. 2 illustrates exemplary host and device apparatuses that are not capable of switching their roles. Hosts and devices may be however configured to be dual-role apparatuses that can operate both as a host and a device. Such dual-role apparatuses comprise a power source and pull-up resistors similar to host 210, but they also comprise pull-down resistors coupled to ground as illustrated for device 220. A dual-role device may change its appearance by alternately pulling both of the CC pins up and down based on its preferences. A dual-role apparatus may be for example configured to pull up for 30% of the time and to pull down for 70% of the time. If a dual-role apparatus acting initially as a device would determine to change the power delivery direction, it would interrupt the connection by pulling the CC pins up, in order to appear as a host. This would cause the apparatus initially acting as a host to stop delivering power, but this would also interrupt the data transfer between the dual-role apparatuses. The initial host may also keep pulling the CC pins up for a while depending on its preferences and this may cause a delay before the initial device is agreed to change its role to a host.

The dual-role functionality enables changing the current direction between two dual-role apparatuses, but this is not possible if one of the apparatuses supports only a single role. Also, changing the roles involves a negotiation period, where the dual-role apparatuses present themselves either as a host or a device based on their preferences. The negotiation period takes time and in some applications it would be desirable to guarantee a rapid change of the current direction. It would be also beneficial to allow changing current direction without interfering with the data transmission or changing the data transfer roles. It would be also beneficial to allow changing current direction between two single-role apparatuses, or between a single-role apparatus and a dual-role apparatus, for example to avoid implementing the dual-role functionality in simple accessories.

The current USB Type C apparatuses do not support the functionality described above. It is therefore an object of the invention to provide methods to enable a fast change of the power delivery direction without interrupting the data communication. It is also an object of the invention to enable changing power delivery direction between apparatuses that support only one USB role, that is, a host role or a device role.

Figure 3:
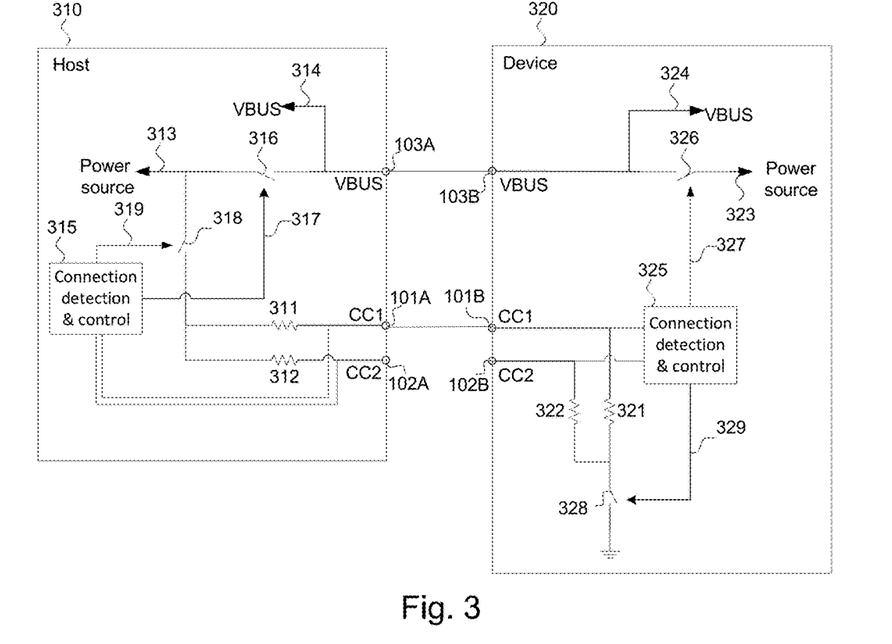
FIG. 3 illustrates exemplary host and device apparatuses configured to change direction of the power delivery direction, according to embodiments of the invention.

FIG. 3 presents exemplary block diagrams of a host apparatus 310 and a device apparatus 320, in accordance with at least one embodiment of the invention. Host 310 and/or device 320 may be also configured to be dual-role apparatuses, as described above. In this example it is assumed that host 310 and device 320 are connected such that a connection is established between CC1 (101A) of the host 310 and CC1 (101B) of the device 320, as shown in FIG. 3 by the dashed line.

Host 310 may comprise a power source 313, a VBUS switch 316, control circuitry 315 providing a VBUS control signal 317, and pull-up resistors 311 and 312, similar to the corresponding elements 213, 216, 215, 217, 211, and 212 inside host 210. In addition, host 310 may comprise a configuration channel switch 318 (CC switch) which the control circuitry 315 may control by a configuration channel control signal 319 (CC control signal). Host 310 may further comprise a VBUS input 314 for receiving power from VBUS terminal 103A.

Device 320 may comprise a power source 323, VBUS switch 326, control circuitry 325 providing a VBUS control signal 327. These elements may perform at least functions similar to the corresponding elements 313, 316, and 315 at the host side. Device 320 may also comprise pull-down resistors 321 and 322 similar to pull-down resistors 221 and 212 of device 220. Device 320 may comprise at least one configuration channel switch 328 (CC switch) coupled between at least one CC pin and a reference potential, for example ground potential. CC switch 328 may be placed as a common switch between pull-down resistors 321, 322 and ground (as in FIG. 3) or it may be implemented as a plurality of separate switches between CC pins 101B, 102B and the pull-down resistors 321, 322.

Some components illustrated in FIG. 3 may not be present in all embodiments of the invention and apparatuses 310 and 320 may also comprise components not shown in FIG. 3. For example, connections from components to each other may be implemented via other components that may or may not be shown in FIG. 3. Such connections may comprise direct electrical connections as well as inductive and capacitive coupling.

The exemplary structural elements of FIG. 3 may be generally seen as means for performing one or more functions. For example, power sources 313, 323 and VBUS terminals 103A, 103B may be seen as examples of means for supplying power, means for applying power, means for delivering power, or means for providing power; VBUS inputs 314, 324 and VBUS terminals 103A, 103B may be seen as examples of means for receiving power, means for drawing power, or means for sourcing power; switches 316, 318, 326, 328 may be seen as examples of switching means; resistors 311, 312, 322, 321 may be seen as examples of resistive means or means for decreasing a current; control circuitries 315, 325 and control signals 317, 319, 327, 329 may be seen as examples of control means. These means may be configured to perform functions described elsewhere in this document.

Figure 4:
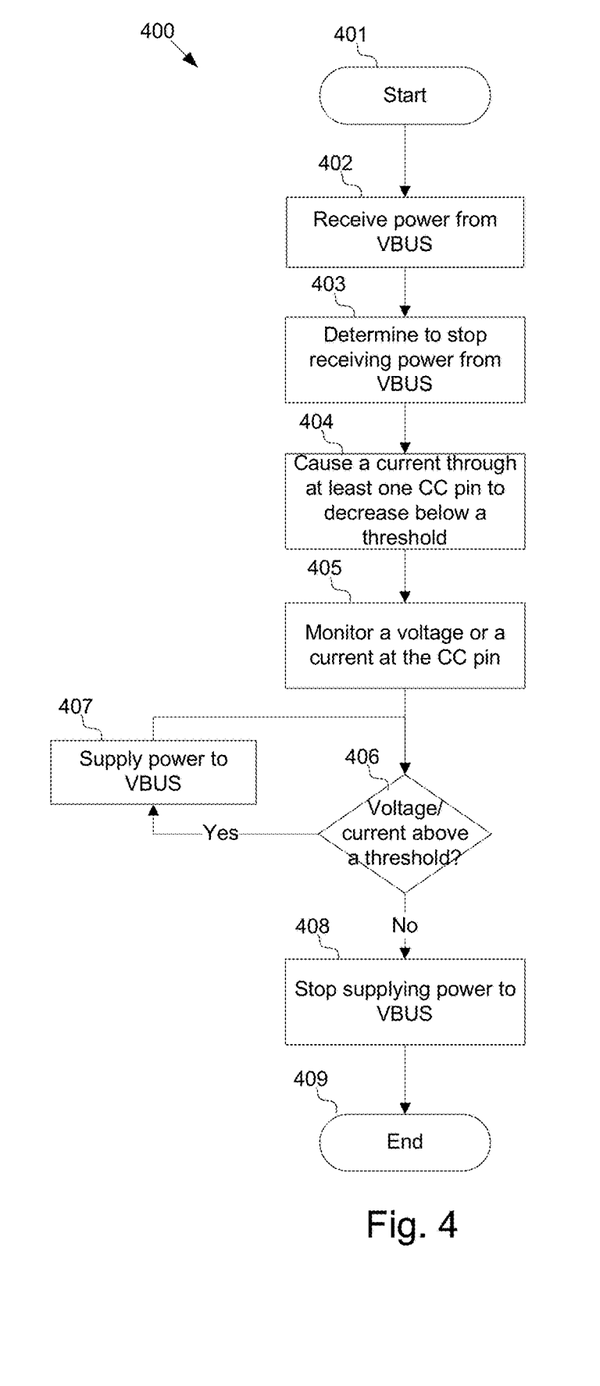
FIG. 4 presents a flow chart describing an exemplary method performed in a device apparatus, according to embodiments of the invention.

FIG. 4 presents an example flow diagram 400 of an example method performed by device 320 for controlling power supply and power reception in device apparatus 320, in accordance with at least one embodiment of the invention.

The method may be initiated at block 401 when device 320 has been connected to a host. The device 320 may detect connection to a host by monitoring a current through or a voltage at CC pin 101B or 102B. In the case of FIG. 3, device 320 may detect a voltage at a predetermined range or a current through CC pin 101B, which may indicate that device 320 has been connected to a compatible host. Consequently, device 320 may receive power via VBUS terminal 103A at block 402.

When device 320 is receiving power from VBUS terminal, it may determine to switch power delivery roles with the host, that is, the device may wish to stop receiving power from VBUS 103B and to supply power from its power source 323 via VBUS 103A to the host. For example, an accessory device that comprises a power plug receptacle or a wireless power interface may detect that it is receiving power from a power source other than the data interface. In such a case, it may be beneficial to provide this power to the host, which may be a battery-powered apparatus itself. Similarly, an energy harvesting source may suddenly begin to produce a sufficient amount of power and it might be useful to provide the harvested energy to the host. The present invention enables communication of device 320 with the host. For instance, based on the communication the host may stop power delivery and device 320 is able to safely supply power via VBUS 103A.

At 403, device 320 may determine to stop receiving power from VBUS.

At 404, device 320 may cause a current through at least one CC pin to decrease below a threshold. This may cause termination of power delivery via the voltage terminal. For example, control circuitry 325 may cause CC switch 328 to be opened by setting CC switch control signal 329 to a disabled state. When CC switch 328 is opened, the current flow from the power source of the host via the CC pin 101B to device 320 is terminated. Consequently, the host is forced to terminate power supply to VBUS terminal 103A. Power reception at VBUS terminal 103B is terminated. Alternatively, device 320 may cause the current through CC pin 101B to decrease below a threshold by other means. For example, device 320 may reconfigure a current sink to draw a current which is below the threshold. This exemplary method may also comprise monitoring a voltage at or a current through VBUS 103B after causing the current through the configuration channel (CC) terminal to decrease below a threshold to determine whether the host has indeed terminated power supply via VBUS.

At 405, device 320 may start monitoring a voltage and/or a current at the connected CC pin 101B. A host is configured to pull-up its CC pins. Therefore, monitoring the connected CC pin enables device 320 to determine whether the connection to the host is maintained even if device 320 has disconnected CC pin 101B from ground by opening CC switch 328. This allows device 320 to safely supply power to the host until the connection to the host is lost, or until the host determines to stop receiving power from device 320. For example, if CC switch 328 is open, no current is flowing from the power source of the host via CC pin 101B of the device. Hence, device 320 is able to detect the voltage supplied by the host at the CC pin 101B and determine that connection to host is maintained. In some embodiments, device 320 may not have switched the current flowing through CC pins 101B completely off, but instead device 320 may have restricted it to a predetermined current level that is sufficiently low to cause the host to determine that connection to device 320 is lost and to terminate power supply to the VBUS terminal 103A. In this case, device 320 may monitor the current through CC pin 101B to detect whether connection to host is maintained or not.

At 406, device 320 may detect a change in the voltage at or the current through the at least one configuration channel (CC) terminal. In one embodiment, detecting the change in the voltage or the current at the configuration channel terminal comprises detecting whether the voltage or the current at the configuration channel terminal decreases below a threshold. Device 320 may for example detect that a voltage at CC pin 101B has decreased below a predetermined level or that voltage at the CC pin 101B is substantially on the ground potential level. This may indicate that connection to the host has been lost. This may happen for example if a user unplugs a cable from the host or the device 320, while device 320 is supplying power to VBUS 103B. Alternatively, if device 320 has not switched the current flowing through CC pins 101B completely off, device 320 may detect when a current stops to flow through CC pin 101B and determine that the connection to the host has been lost.

At 407, device 320 may determine to supply power to VBUS 103B in response to determining at block 406 that device 320 is still connected to a host. For example, control circuitry 325 may cause VBUS switch 326 to be closed by setting VBUS control signal 327 to an enabled state to cause a current to flow from power source 323 to VBUS terminal 103B. While supplying power to VBUS 103B, device 320 may continue to monitor a voltage at or a current through CC pin 101B, as defined in block 405. Device 320 may also continue to detect whether the voltage at or the current through CC pin 101B reaches a threshold, as defined in block 406.

At 408, device 320 may determine to stop supplying power to VBUS, in response to detecting a change in the voltage at or the current through CC pin 101B. Hence, device 320 may stop delivering power to the host if it is determined at device 320 that connection to the host has been lost. Control circuitry 325 may cause VBUS switch 326 to be opened by setting VBUS control signal 327 to a disabled state in order to prevent a current to flow from power source 323 to VBUS terminal 103B.

The process may be ended at 409. The process may be re-initiated after normal operation has been restored, that is, when a host is supplying power again to device 320.

Figure 5:
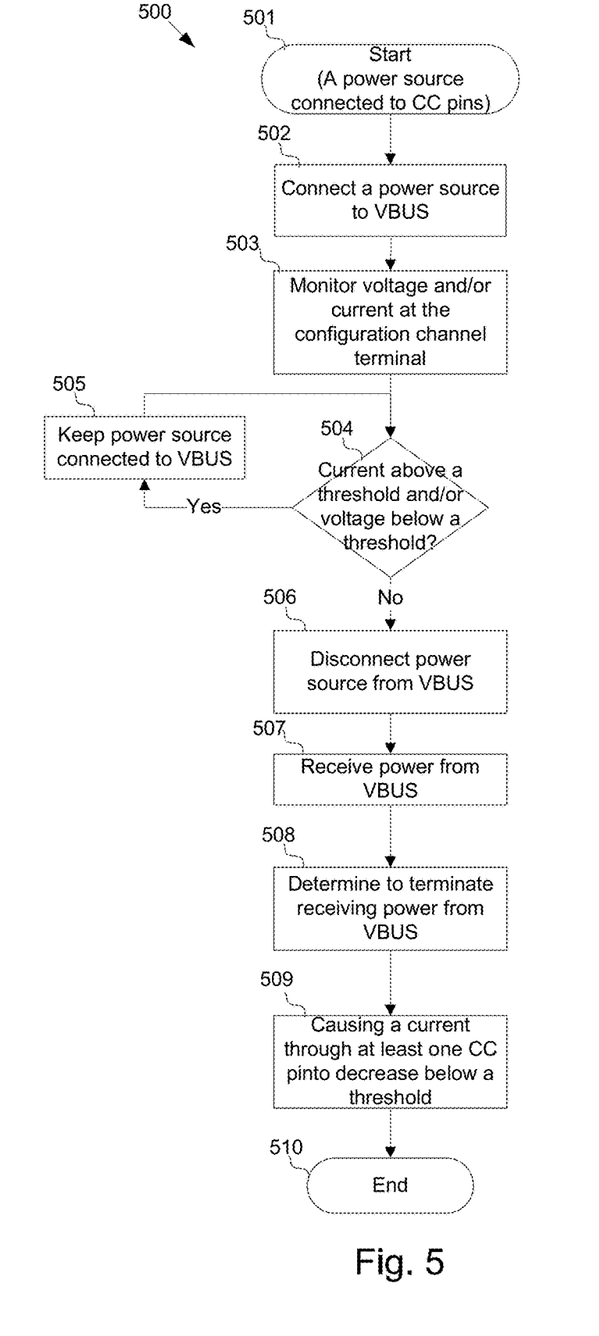
FIG. 5 presents a flow chart describing an exemplary method performed in a host apparatus, according embodiments of the invention.

FIG. 5 presents an example flow diagram 500 of an example method performed by host apparatus 310, for controlling power supply and power reception in the host 310, in accordance with at least one embodiment of the invention.

The method may be initiated at block 501. As described in FIG. 3, host 310 may comprise power source 313 coupled to at least one configuration channel terminal 101A, 102. Hence, host 310 is able to detect connection to a device by monitoring a voltage at or a current through at least one CC pin 101A or 102. In the case of FIG. 3, host 310 detects a voltage at a predetermined range at CC pin 101A or a current above a predetermined threshold flowing through CC pin 101A, which indicates that host 310 has been connected to a compatible device. Consequently, host 310 may connect power source 313 to VBUS 103A such that power is supplied via VBUS 103A to a device at block 502. For example, control circuitry 315 may cause VBUS switch 316 to be closed by setting VBUS control signal 317 to an enabled state to cause a current flow from power source 313 to VBUS 103A. The power source applied to VBUS may or may not be the same power source, current source, or voltage source that is connected to the CC pins.

At 503, host 310 may monitor a voltage at or a current through CC pin 101A. A device is configured to pull its CC pins down and therefore monitoring the connected CC pin 101A enables the host 310 to determine whether a connection to the device has been lost or whether the connected device wishes to change the direction of power delivery through the VBUS terminal 103A.

At 504, host 310 may detect a change in the voltage at or the current through CC pin 101A. In one embodiment, detecting the change in the voltage or the current comprises detecting whether the current through CC pin 101A decreases below or is equal to a threshold. The threshold may be set for example to a current level of 1 mA or to be substantially zero. In another embodiment, detecting the change in the voltage or the current comprises detecting whether the voltage at CC pin 101A increases above or is equal to a threshold. The threshold may be set for example to a nominal voltage level of the interface, for example to 5 V, or to another suitable voltage level. A change in the voltage at or the current through CC pin 101A may occur for example if a user unplugs the device from host 310 and the voltage at CC pin 101A is no longer pulled down from the device side. This prevents current flow through CC pin 101A and causes the voltage at CC pin 101A to increase. A change in the voltage at or the current through CC pin 101A may occur also when a device intentionally disconnects the connected CC pin from the ground potential or otherwise restricts the current via the connected CC pin, for example to indicate to host 310 that it wishes to change the power delivery direction through the VBUS terminal 103B.

At 505, host 310 may continue to keep power source 313 connected to VBUS 103A, in response to determining at 504 that it is still connected to a device. While supplying power to VBUS 103A, host 310 may continue to monitor a voltage at or a current through CC pin 101A, as defined in block 503. Host 310 may also continue to detect whether the voltage at or the current through CC pin 101A exceeds or reaches a threshold, as defined in block 504.

In response to detecting a change in the voltage at or the current through CC pin 101A at 504, host 310 may determine to disconnect power source 313 from VBUS 103A. For example, control circuitry 315 may cause VBUS switch 316 to be opened by setting VBUS control signal 317 to a disabled state in order to prevent a current flow from power source 313 to VBUS 103A. The host 310 may also prepare for receiving power through VBUS 103A. If host 310 is a dual-role apparatus, it would normally start role negotiation by alternately pulling the voltage at both CC pins 101A and 102 up and down. Hence, a dual-role apparatus supporting embodiments of the invention may wait for a predetermined time interval before starting the role negotiation. That is, if a host detects a change in the voltage at or the current through CC pin 101A, as defined in block 504, the host may wait for a predetermined time interval before presenting itself as a device (e.g. by pulling CC pins 101A, 102 down). This ensures that a device has sufficient time to start supplying power to VBUS before host 310 deems the connection to the device to be lost. The duration of such predetermined time interval may be configured to be between 10 ms to 100 ms, for example.

At 507, host 310 may receive power via VBUS, while keeping power source 313 connected to at least one configuration channel terminal 101A, 102A. Based on detecting received power at VBUS 103A, host 310 may determine that connection to device has not been lost. Hence, data communication between host 310 and the device may continue without interruption. The host 310 may detect received power at VBUS terminal 103A for example by monitoring the direction of the current flow through VBUS terminal 103A. Alternatively, host 310 may monitor a voltage at or current through the VBUS terminal 103A, when the host 310 is not supplying power to VBUS terminal 103A. If the current flow is towards the host 310 or if a voltage at or a current through the VBUS terminal 103A is detected when host 310 is not supplying power to VBUS, host 310 may determine that power is received at VBUS terminal 103A.

If host 310 wishes to change the current direction again, in other words to start supplying power to the device, host 310 may determine to terminate receiving power via VBUS 103A at block 508. This may happen for example if a device has offered to supply power to host, but the host does not wish to receive power from the connected device anymore. Host 310 may be for example connected to mains power so it may not necessarily need to receive power from the device.

At 509, after determining to terminate receiving power, host 310 may cause a current through the configuration channel terminal to decrease below a current threshold. For example, control circuitry 315 may cause CC switch 318 to be opened by setting CC switch control signal 319 to a disabled state. When CC switch 318 has been opened, the current flow from the power source of the host via the CC pin 101B to device 320 is terminated. Consequently, the device will assume loss of connection and terminate supplying power to VBUS. Alternatively, host 310 may cause the current through CC pin 101A to decrease below the threshold by other means. For example, host 310 may reconfigure a current source to supply a current, which is below the threshold.

The method may be ended at 510. The method may be re-initiated for example when a new connection has been established or normal operation between two connected apparatuses has been restored.

It should be understood that embodiments presented in FIG. 4 and FIG. 5 may be modified by combining, replacing, reordering, and removing blocks and that blocks presented in one figure may be used in another figure to create further embodiments that do not depart from the scope of the invention.

Embodiments of the invention may be implemented in a docking mode of a standardized interface, such as for example the USB Type-C interface. A docking mode may include identifying the connected devices as capable of operating according to proprietarily defined functionality. The docking mode may include for example re-assigning at least one the terminals of the interface to a different purpose or using a different communication protocol. The docking mode may be entered for example by exchanging identification data over the configuration channel or a data channel of the interface.

A device may send a control message via at least one configuration channel terminal. The control message may include identification data and/or a request to enter a docking mode. A host may receive the control message from at least one configuration channel terminal. In response to receiving the control message, the host may allow to receive power via the voltage terminal while keeping the power source connected to the at least one configuration channel.

A host may send a control message via at least one configuration channel terminal. The control message may include identification data and/or a request to enter a docking mode. A device may receive the control message from at least one configuration channel terminal. In response to receiving the control message, the device may supply power via the voltage terminal, without pulling the configuration channels up.

Alternatively, the docking mode may be indicated by connecting a predetermined resistance to at least one configuration channel pin or a predetermined combination of resistances to a plurality of configuration channel pins. In response to detecting a predetermined resistance at one or more configuration channel terminals, the host may allow to receive power via the voltage terminal while keeping the power source connected to the at least one configuration channel. In response to detecting a predetermined resistance at one or more configuration channel terminals, the device may supply power via the voltage terminal, without pulling the configuration channels up.

Embodiments of the invention may be also applied without entering the docking mode. A host apparatus that is not aware of the embodiments of the invention will only notice that another apparatus is supplying power without pulling the configuration channel pins up according to the USB Type-C standard. This is not a problem because a USB Type-C apparatus need to be anyway designed to comply with non-standardized chargers that have only implemented a voltage bus and where the power at the VBUS is switched on regardless of the state of the configuration channel terminals. Hence, the embodiments of the invention can be safely applied also without entering the docking mode. However, it is beneficial to apply the embodiments in the docking mode, because this ensures that a host will accept the power supplied by the device.

Figure 6:
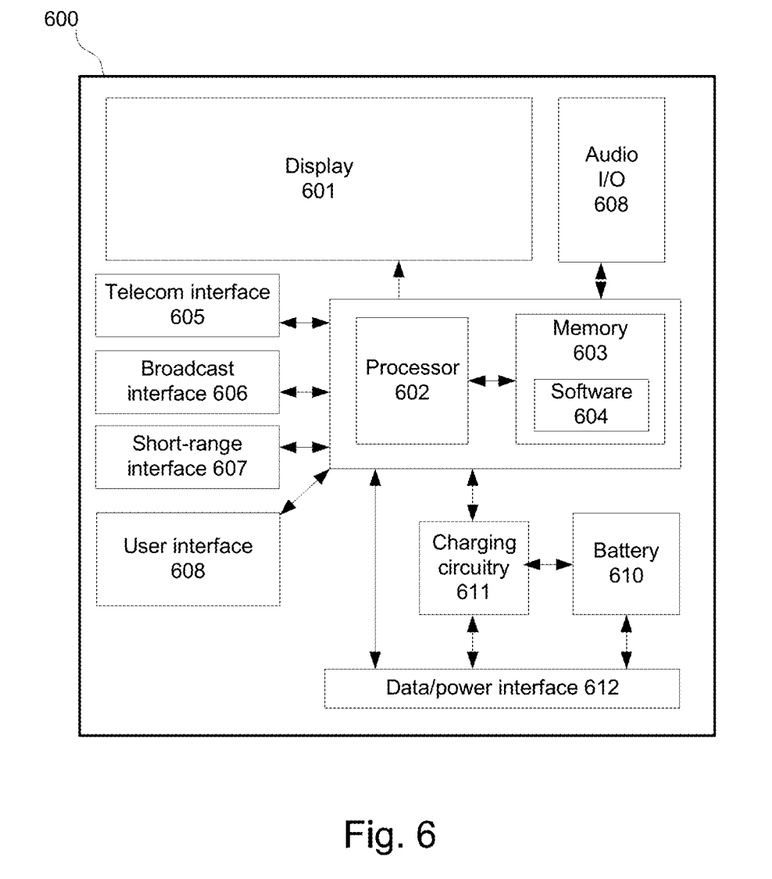
FIG. 6 illustrates an example of a host or a device apparatus implementing one or more embodiments of the invention.

FIG. 6 presents an exemplary apparatus where one or more embodiments presented herein may be implemented. Apparatus 600 may include at least one processor 602 in connection with at least one memory 603 or other computer readable media. Memory 603 may be any type of information storing media including random access memory (RAM), read-only memory, ROM, programmable readable memory, PROM, erasable programmable memory, EPROM, and the like, and it may contain software in form of computer executable instructions. Memory 603 may be for example encoded with instructions that, when executed by a computer, such as for example processor 602, cause the apparatus 600 to perform at least parts of the example methods illustrated in flow diagrams 400 and/or 500.

Apparatus 600 may also comprise one or more communication interfaces, for example telecom interface 605, such as for example a Global System for Mobile Communications, GSM, Wideband Code Division Multiple Access, WCDMA, or 3$^{rd}$ Generation Partnership Project—Long term Evolution, 3GPP LTE, cellular radio; a broadcast interface 606, such as for example Digital Video Broadcasting, DVB, Frequency Modulation, FM, Digital Audio Broadcasting, DAB, or Chinese Mobile Multimedia Broadcasting, CMMB, radio; or a short-range radio interface 607, such as for example a Bluetooth radio, a wireless local area network radio, WLAN, or a near field communication system, NFC. Apparatus 600 may further comprise a user interface 608, display 601, and audio input/output 608 for communicating with the user and a wireless power interface 609 for receiving and/or transmitting energy via electromagnetic induction. The apparatus may also comprise a battery capable of being charged and to deliver power for various operations performed in apparatus 600.

In particular, apparatus 600 may comprise a data and/or power interface, such as for example a USB Type-C receptacle or plug. The data/power interface may be connected to processor 602 and memory 603, and software 604 may comprise instructions to control operations at the data/power interface 612 to implement methods disclosed herein. Data/power interface 612 may be connected to a charging circuitry 611 that may control charging operations in apparatus 600. Data/power interface 612 may for example deliver the received power to a charging circuitry 611 controlling charging of battery 610 and/or directly to the battery 610. It is to be understood that apparatus 600 illustrates only an exemplary apparatus capable of implementing embodiments described herein. For example, other apparatuses implementing at least one of the embodiments may comprise only some elements of apparatus 600.

Examples of apparatus 600 include a mobile phone and a passive headset accessory coupled via the data/power interface 612. The headset accessory may comprise a charging interface in order to charge the mobile phone when the headset accessory is coupled to the phone. In normal operation, the phone would supply power to the headset, but when a charger is connected to the headset, the direction of the power delivery should be changed to charge the phone. However, the headset should be powered all the time and data communication between the headset and the phone should not be interrupted. Such capability may be needed for example when the phone needs to be charged during a long phone call with an audio headset connected to the USB Type C interface, which may be the only charging interface of the phone. Furthermore, the headset could be implemented as a simple single-role apparatus, but the USB Type C specification in its present format does not allow a device apparatus to supply power to a host apparatus.

Another example apparatus is an external hard drive comprising a charging interface. The external hard drive may or may not be connected to mains power. If the mains power plug is disconnected during data transfer, the connected apparatus, for example a laptop or a mobile phone, should start immediately supplying power to the external hard drive. If the mains power connected the external hard drive may start to supplying power to charge the connected apparatus. The embodiments could be also used in cars that comprise a docking station, which is normally powered by the car with for example a voltage of 12 V. When the car is switched off by the driver, the docking station should draw the power from a mobile phone coupled to the docking station. And, when the car is switched on by the driver, the docking station could supply power to charge the mobile phone. In both cases, the data transfer between the docking station and the mobile phone should not be interrupted. Further examples include a keyboard dock for a tablet computer and a camera grip for a mobile phone. A keyboard dock or a camera grip may comprise a charging interface and/or a battery with high capacity. The keyboard dock or camera grip may power the tablet or mobile phone when a charger is connected or when the battery is full, but they may also need power from the tablet or the mobile phone if they are not connected to mains power and their battery levels drop below the minimum level for operation.

Embodiments of the invention may include supplying power to at least one terminal of an interface and/or receiving power via at least one terminal of the interface. Supplying power may be understood in general as providing a voltage or a current, applying a supply voltage or a current, delivering a voltage or a current, or operating as a current or voltage source. Receiving power may be understood as receiving a voltage or a current, drawing a current, sourcing a current, or operating as a current sink.

Without in any way limiting the scope, interpretation, or application of the claims appearing below, a technical effect of one or more of the example embodiments disclosed herein is to enable faster change of current direction in a data and/or power interface. Another technical effect of one or more of the example embodiments disclosed herein is to enable changing power delivery direction without interfering with data transmission at the interface. Yet another technical effect of one or more of the example embodiments disclosed herein is to enable changing power delivery roles between apparatuses without changing their roles in data communication. Yet another technical effect of one or more of the example embodiments disclosed herein is to enable changing power delivery role at a device that is not supporting dual-role operation.

Embodiments of the present invention may be implemented in software, hardware, application logic or a combination of software, hardware and application logic. The software, application logic and/or hardware may reside on a host apparatus or a device apparatus such as for example a mobile phone, a tablet, a laptop, a spare battery pack, a docking station, a keyboard, an audio headset, an external memory device, a power harvesting device, a speaker, a display, or the like. In an example embodiment, the application logic, software or an instruction set is maintained on any one of various conventional computer-readable media. In the context of this document, a "computer-readable medium" may be any non-transitory media or means that can contain, store, communicate, propagate or transport the instructions for use by or in connection with an instruction execution system, apparatus, or device, such as a computer, with one example of a computer described and depicted in FIG. 6. A computer-readable medium may comprise a computer-readable storage medium that may be any non-transitory media or means that can contain or store the instructions for use by or in connection with an instruction execution system, apparatus, or device, such as a computer.

Although some embodiments of the invention may be described as being implemented by structural elements, the scope of the invention should be understood to cover any means for achieving a particular result in accordance with the structural element in question. Processor 602, memory 603, and software 604 may be seen as means for performing the methods described herein. For example, processor 602, memory 603, and software 604 may be seen as means for processing, means for causing, means for detecting, means for determining, means for sending, means for transmitting, means for receiving, means for enabling, means for disabling, means for providing, means for connecting, means for disconnecting, or the like.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The invention claimed is:

1. A method, comprising:
    determining, by a device, an orientation of a plug coupled to a data interface of the device, wherein the data interface comprises a plurality of data terminals and at least two configuration channel terminals, and wherein the orientation is determined by at least detecting a voltage at, and/or a current through, one of the at least two configuration channel terminals;
    determining, by the device, to terminate receiving power via a voltage terminal;
    causing, by the device, the current through the one of the at least two configuration channel terminals to decrease below a first threshold to cause termination of power reception via the voltage terminal;
    determining, by the device, to supply power to the voltage terminal;
    monitoring, by the device, the voltage at, and/or the current through, the one of the at least two configuration channel terminals; and
    determining, by the device, to stop supplying power to the voltage terminal, in response to detecting a change in the voltage at, and/or the current through, the one of the at least two configuration channel terminals.

2. The method of claim 1, wherein said detecting the change in the voltage at, and/or the current through, the one of the at least two configuration channel terminals comprises detecting whether the voltage at the one of the at least two configuration channel terminals and/or the current through the one of the at least two configuration channel terminals decreases below a second threshold.

3. The method of claim 1, further comprising:
    monitoring the voltage at the voltage terminal and/or the current through the voltage terminal after causing the current through the one of the at least two configuration channel terminals to decrease below the first threshold to determine whether power reception via the voltage terminal has been terminated.

4. The method of claim 1, wherein the interface comprises a universal serial bus type C interface.

5. An apparatus comprising:
    an interface comprising a voltage terminal and at least two configuration channel terminals;
    at least one processor;
    at least one memory including computer program code;
    the at least one memory and the computer program code configured to, with the at least one processor, cause the apparatus at least to:
        determine an orientation of a plug coupled to the interface of the apparatus, wherein the orientation is determined at least by detecting a voltage at, and/or a current through, one of the at least two configuration channel terminals;
        determine to terminate receiving power via the voltage terminal and cause the current through the one of the at least two configuration channel terminals to decrease below a first threshold to cause termination of power reception via the voltage terminal;
        determine to supply power to the voltage terminal;
        monitor the voltage at, and/or the current through, the one of the at least two configuration channel terminals; and
        determine to stop supplying power to the voltage terminal, in response to detecting a change in the voltage at, and/or the current through, the one of the at least two configuration channel terminals.

6. The apparatus of claim 5, wherein said detecting the change in the voltage at, and/or the current through, the one of the at least two configuration channel terminals comprises detecting whether the voltage at the one of the at least two configuration channel terminals and/or the current through the one of the at least two configuration channel terminals decreases below a second threshold.

7. The apparatus of claim 5, wherein the at least one memory and the computer program code are further configured to, with the at least one processor, cause the apparatus at least to:
    monitor the voltage at the voltage terminal and/or the current through the voltage terminal after causing the current through the one of the at least two configuration channel terminals to decrease below the first threshold; and
    determine whether power reception via the voltage terminal has been terminated based on said monitoring the voltage at the voltage terminal and/or the current through the voltage terminal.

8. The apparatus of claim 5, wherein the interface comprises a universal serial bus type C interface.

9. A method comprising:
    determining, by a host, an orientation of a plug coupled to a data interface of the host, wherein the data interface comprises a plurality of data terminals and at least two configuration channel terminals, and wherein the orientation of the plug is determined at least by detecting a voltage at, and/or a current through, one of the at least two configuration channel terminals;
    connecting, by the host, a power source to a voltage terminal of the data interface, wherein the power source is further connected to the at least two configuration channel terminals of the data interface;
    monitoring, by the host, the voltage at, and/or the current through, the one of the at least two configuration channel terminals;
    in response to detecting a change in the voltage at, and/or the current through, the one of the at least two configuration channel terminals, determining, by the host, to disconnect the power source from the voltage terminal and to wait a predetermined time before pulling down the at least two configuration channel terminals; and
    receiving, by the host, power via the voltage terminal.

10. The method of claim 9, wherein detecting the change in the current through the one of the at least two configuration channel terminals comprises detecting whether the current decreases below a current threshold.

11. The method of claim 9, wherein detecting the change in the voltage at the one of the at least two configuration channel terminals comprises detecting whether the voltage increases above a voltage threshold.

12. The method of claim 9, further comprising:
determining, by the host, to terminate receiving power via the voltage terminal and causing the voltage at the one of the at least two configuration channel terminals to decrease below a second voltage threshold.

13. The method of claim 9, wherein the interface comprises a universal serial bus type C interface.

14. An apparatus comprising:
an interface comprising a voltage terminal and at least two configuration channel terminals;
a power source connected to the at least two configuration channel terminals;
at least one processor;
at least one memory including computer program code;
the at least one memory and the computer program code configured to, with the at least one processor, cause the apparatus at least to:
determine an orientation of a plug coupled to the interface, wherein the orientation of the plug is determined at least by detecting a voltage at, and/or a current through, one of the at least two configuration channel terminals;
connect the power source to the voltage terminal of the data interface, wherein the power source is further connected to the at least two configuration channel terminals of the data interface;
monitor the voltage at, and/or the current through, the one of the at least two configuration channel terminals;
in response to detecting a change in the voltage at, and/or the current through, the one of the at least two configuration channel terminals, determine to disconnect the power source from the voltage terminal and to wait a predetermined time before pulling down the at least two configuration channel terminals; and
receive power via the voltage terminal.

15. The method of claim 14, wherein detecting the change in the current through the one of the at least two configuration channel terminals comprises detecting whether the current decreases below a current threshold.

16. The method of claim 14, wherein detecting the change in the voltage at the one of the at least two configuration channel terminals comprises detecting whether the voltage increases above a voltage threshold.

17. The apparatus of claim 14, wherein the at least one memory and the computer program code are further configured to, with the at least one processor, cause the apparatus at least to:
determine to terminate receiving power via the voltage terminal and cause the voltage at the one of the at least two configuration channel terminals to decrease below a second voltage threshold.

18. The method of claim 14, wherein the interface comprises a universal serial bus type C interface.

19. A computer-readable medium encoded with instructions that, when executed by a computer, cause an apparatus to:
determine an orientation of a plug coupled to an interface of the apparatus, wherein the interface comprises a voltage terminal and at least two configuration channel terminals, and wherein the orientation is determined at least by detecting a voltage at, and/or a current through, one of the at least two configuration channel terminals,
determine to terminate receiving power via the voltage terminal;
cause the current through one of the at least two configuration channel terminals to decrease below a threshold to cause termination of power reception via the voltage terminal;
determine to supply power to the voltage terminal;
monitor the voltage at, and/or the current through, the one of the at least two configuration channel terminals; and
determine to stop supplying power to the voltage terminal, in response to detecting a change in the voltage at, and/or the current through, the one of the at least two configuration channel terminals.

20. A computer-readable medium encoded with instructions that, when executed by a computer, cause an apparatus to:
determine an orientation of a plug coupled to an interface of the apparatus, wherein the interface comprises a voltage terminal and at least two configuration channel terminals, and wherein the orientation of the plug is determined at least by detecting a voltage at, and/or a current through, one of the at least two configuration channel terminals;
connect a power source to the voltage terminal, wherein the power source is further connected to the at least two configuration channel terminals of the interface;
monitor the voltage at, and/or the current through, the one of the at least two configuration channel terminals;
in response to detecting a change in the voltage at, and/or the current through, the one of the at least two configuration channel terminals, determine to disconnect the power source from the voltage terminal and to wait a predetermined time before pulling down the at least two configuration channel terminals; and
receive power via the voltage terminal.

* * * * *